United States Patent
Chacin et al.

(10) Patent No.: US 7,700,376 B2
(45) Date of Patent: Apr. 20, 2010

(54) EDGE TEMPERATURE COMPENSATION IN THERMAL PROCESSING PARTICULARLY USEFUL FOR SOI WAFERS

(75) Inventors: Juan Chacin, Palo Alto, CA (US); Sairaju Tallavajula, Santa Clara, CA (US); Sundar Ramamurthy, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 712 days.

(21) Appl. No.: 11/374,715

(22) Filed: Mar. 14, 2006

(65) Prior Publication Data

US 2006/0228818 A1 Oct. 12, 2006

Related U.S. Application Data

(60) Provisional application No. 60/669,162, filed on Apr. 6, 2005.

(51) Int. Cl.
*H01L 21/00* (2006.01)

(52) U.S. Cl. .................... 438/5; 438/795; 257/E21.525

(58) Field of Classification Search ................... 438/18, 438/5, 14, 795, 798; 257/E21.525
See application file for complete search history.

(56) References Cited

U.S. PATENT DOCUMENTS

| | | | | |
|---|---|---|---|---|
| 5,970,313 A * | 10/1999 | Rowland et al. | ............... | 438/17 |
| 6,232,134 B1 * | 5/2001 | Farber et al. | ............... | 438/9 |
| 6,393,210 B1 * | 5/2002 | Wu | ............... | 392/416 |
| 6,853,802 B2 | 2/2005 | Neyret et al. | ............... | 392/416 |
| 6,864,189 B2 * | 3/2005 | Hayes et al. | ............... | 438/758 |
| 6,916,744 B2 | 7/2005 | Achutharaman et al. | .... | 438/689 |
| 7,039,556 B2 * | 5/2006 | Whitefield et al. | ........... | 702/183 |
| 2002/0001788 A1 * | 1/2002 | Sakamoto et al. | ............. | 432/24 |
| 2002/0014483 A1 * | 2/2002 | Suzuki et al. | ............... | 219/486 |
| 2004/0121605 A1 * | 6/2004 | Maydan et al. | ............. | 438/694 |
| 2005/0032251 A1 * | 2/2005 | Yu | ............... | 438/14 |
| 2005/0094990 A1 * | 5/2005 | Neyret et al. | ............... | 392/416 |
| 2005/0201894 A1 * | 9/2005 | Suzuki et al. | ............... | 422/62 |
| 2006/0004493 A1 * | 1/2006 | Hwang et al. | ............... | 700/300 |
| 2006/0031788 A1 * | 2/2006 | Bauer | ............... | 716/1 |
| 2006/0228473 A1 * | 10/2006 | Satoh et al. | ............... | 427/248.1 |
| 2006/0284720 A1 * | 12/2006 | Bras | ............... | 337/57 |

* cited by examiner

*Primary Examiner*—W. David Coleman
*Assistant Examiner*—Latanya Crawford
(74) *Attorney, Agent, or Firm*—Law Offices of Charles Guenzer (57) ABSTRACT

A retuning process particularly useful with an Ar/$H_2$ smoothing anneal by rapid thermal processing (RTP) of a silicon-on-insulator (SOI) wafer performed after cleavage. The smoothing anneal or other process is optimized including a radial temperature profile accounting for the edge ring and exclusion zone and the vertically structured SOI stack or other wafer gross structure. The optimized smoothing conditions are used to oxidize a bare silicon wafer and a reference thickness profile obtained from it is archived. After extended processing of complexly patterned production wafers, another bare wafer is oxidized and its monitor profile is compared to the reference profile, and the production process is adjusted accordingly. In another aspect, a jet of cooling gas is preferentially directed to the edge ring and peripheral portions of the supported SOI wafer to cool them relative to the inner wafer portions.

19 Claims, 4 Drawing Sheets

EDGE TEMPERATURE COMPENSATION IN THERMAL PROCESSING PARTICULARLY USEFUL FOR SOI WAFERS

RELATED APPLICATION

This application claims benefit of provisional application 60/669,162, filed Apr. 6, 2005.

FIELD OF THE INVENTION

The invention relates to thermal processing of semiconductor substrates and chambers used therefor. In particular, the invention relates to rapid thermal processing of silicon-on-insulator wafers.

BACKGROUND ART

Rapid thermal processing (RTP) is a well known process used in the fabrication of semiconductor integrated circuits when it is desired to quickly heat a wafer or other substrate to a relatively high temperature required for a thermally activated process and to thereafter quickly cool the wafer. RTP chambers typically include an array of high-intensity incandescent lamps, often tungsten halogen lamps, which together with reflector cavities around the lamps direct high-intensity infra-red, visible, and near-ultraviolet radiation toward the wafer. The lamps can be quickly turned on and off, and wafer temperatures in excess of 1000° C. can be achieved in times on the order of 10s or less. An example of such an RTP chamber is the Radiance RTP chamber available from Applied Materials, Inc. of Santa Clara, Calif.

Figure 1:
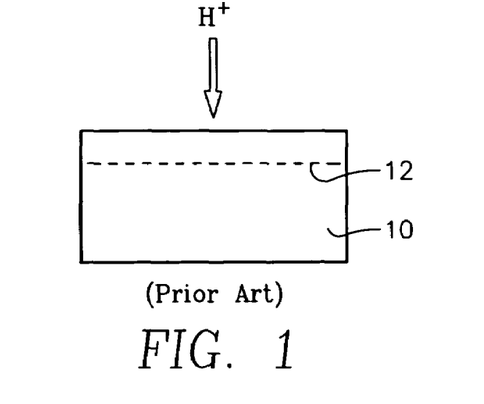
FIGS. 1-6 are cross-sectional views illustrating the conventional fabrication of a silicon-on-insulator (SOI) wafer according to the SOITEC method.
Figure 2:
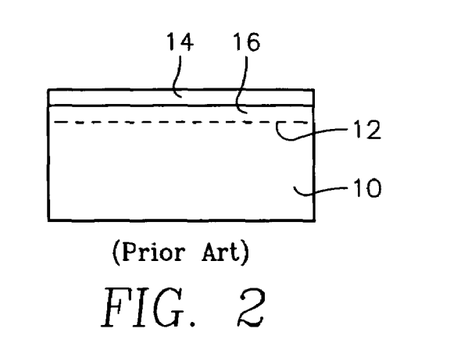
Figure 3:
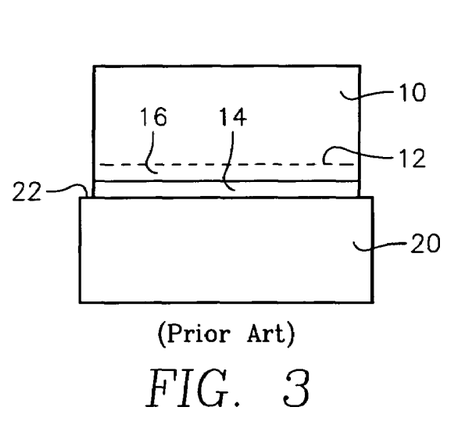

Recently, RTP has been applied to the formation of Silicon-on-Insulator (SOI) wafers fabricated by the cleavage technique developed by SOITEC. In this process, as illustrated in the cross-sectional view of FIG. 1, energetic hydrogen ions H$^+$ are implanted at a predetermined depth from the top surface of a silicon donor wafer 10 to form a hydrogen-rich layer 12. The top surface is then oxidized to form an oxide layer 14 of SiO$_2$, as illustrated in the cross-sectional view of FIG. 2. The oxide layer 14 may have a thickness of about 150 nm, which consumes part of the silicon above the hydrogen-rich layer 12 leaving an underlying silicon layer 16. Exemplary thicknesses are 50 nm for the silicon layer 16 and 150 nm for the oxide layer 14 although the thickness may vary according to the eventual use of the SOI wafer. As illustrated in the cross-sectional view of FIG. 3, the donor wafer 10 is then inverted and bonded by a thermal process to a second, handle silicon wafer 20. Importantly for some aspects of the invention, present bonding techniques require the donor wafer 10 to be somewhat smaller than the handle wafer 20 so that a peripheral edge exclusion 22 develops at the top of the handle wafer 20 outside of the SOI stack. For a 300 mm SOI wafer, the edge exclusion 22 may be approximately 1 to 3 mm wide.

Figure 4:
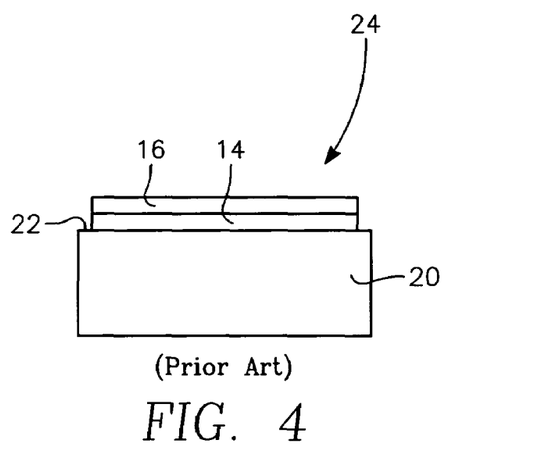

In one method of obtaining the SOI wafer, the hydrogen-rich layer 12 is stressed and chemical or mechanical techniques are used to cleave the bonded wafers 10, 20 along the cleavage line of the hydrogen-rich layer 12, leaving an SOI wafer 24 illustrated in the cross-sectional view of FIG. 4. The SOI wafer 24 includes the monocrystalline silicon layer 16 electrically isolated from the silicon handle wafer 20 by the insulating oxide layer 14. SOI wafers have many uses. Very advanced silicon integrated circuits can be formed in the silicon layer 16 with virtually no leakage or parasitic capacitance to or through the silicon substrate 20, thereby lowering the power consumption and increasing the processing speed of the integrated circuit form in the isolated silicon layer 16. SOI wafers have other uses including micro electromechanical system (MEMS) wafers in which electrically actuated micro structures are formed in silicon layers.

Figure 5:
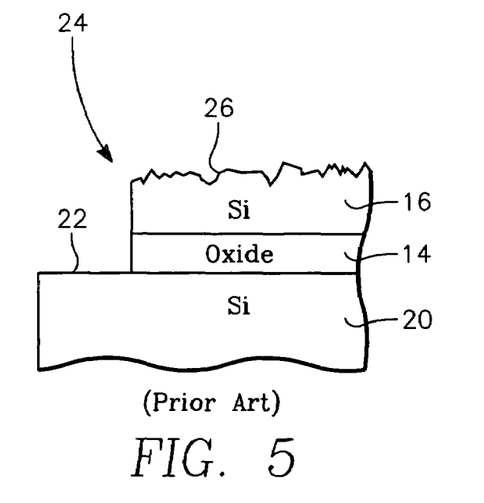

However, the cleavage process does not leave a smooth upper surface in the silicon layer 16. Instead, as illustrated in the expanded cross-sectional view of FIG. 5, an upper surface 26 of the silicon layer 16 is very rough, exhibiting peaks and valleys. It has been found that an RTP anneal in an ambient of argon and hydrogen gases for 30s at 1200° C. is effective at smoothing the structure to form a smooth upper surface 28, illustrated in FIG. 6.

There are other methods of obtaining SOI wafers by layer cleaving, some of which are described by Wolf in *Silicon Processing for the VLSI Era, vol. 4: Deep-Submicron Process Technology*, Lattice Press, 2002, pp. 527-550. Any layer having a cleaved surface is expected to show roughness that needs to be smoothed.

An RTP chamber is well suited for the required smoothing anneal. However, it has become apparent that the temperature must be closely controlled across the wafer. Variations in temperature of as little as 1° C. can cause a defect known as crystal slip, a crystallographic line defect that may extend for distances that may be visible. The slip defect is equivalent to a stress-induced fracture of the monocrystalline silicon layer 16. Any chip containing a slip defect is either inoperative or subject to early failure. The Radiance RTP chamber includes pyrometry and temperature control based on separate control of multiple, for example, seven annular heating zones. The temperature control should be able to provide the required temperature uniformity of 1° C. at 1200° C. Nonetheless, SOI wafers have continued to exhibit unacceptable number of slip defects.

Neyret et al. in U.S. Pat. No. 6,853,802 have suggested that the slip problem arises from the edge exclusion 22. Their solution is to include an extra ring around the wafer periphery to adjust the thermal control at the wafer edge exclusion 22. This solution however is felt to be inflexible since the extra ring needs to be optimized for the different combinations of silicon and oxide thicknesses.

SUMMARY OF THE INVENTION

In a first aspect of the invention, a thermal processing method and apparatus in which a patterned production wafer is processed includes a retuning process and apparatus for improving the uniformity of processing over time. The retuning process may include thermally processing in the production chamber a reference wafer having a different pattern, for example, unpatterned and with less vertical structure, than production wafers according to at least part of the production process which has been optimized for the production wafers. A profile across the reference wafer is archived. For example, a measured radial thickness or temperature profile is measured and stored. After a number of production wafers have been processed in the production chamber, a monitor wafer is processed in that chamber according to the same part of the production process and the profile is remeasured and compared to the archived profile. The production recipe is adjusted accordingly.

In one embodiment of the first aspect of the invention, the production process includes a radiant anneal in an argon/hydrogen ambient of a silicon-on-insulator (SOI) wafer having an edge exclusion region with the radiant energy being applied to the rotating wafer in multiple heating zones. The production process is useful, for example, in smoothing the surface of a cleaved SOI wafer. The reference and monitor process includes an oxidation of another type of wafer, for example, a horizontally unpatterned bare silicon wafer with the same zonal heating in the same radiant heating chamber as the production process. The thickness profile of the reference wafer is archived. After the production process has been performed on production wafers in the chamber, the reference and monitor process is again performed on another monitor wafer. The measured thickness profile of the monitor wafers is compared to the reference profile to readjust the heating intensity and its profile of the production process.

The invention is particularly useful with an $Ar/H_2$ smoothing anneal of an SOI wafer. However, the invention is applicable to other radiant processing including close temperature control, particularly across radial zone of the wafer. However, the invention may be used with other types of production processes and the reference and monitor process is not limited to oxidation.

In a second aspect of the invention practiced in a thermal processing chamber, a wafer to be processed is supported on an edge ring and a jet of inert cooling gas is directed at the edger ring or a peripheral portion of the wafer adjacent the edge ring.

The first and second aspects of the invention may be practiced separately or in combination.

DETAILED DESCRIPTION OF THE PREFERRED EMBODIMENT

Although the invention is not limited by our understanding of its operation, we believe that the slip problem, particularly in semiconductor-on-insulator (SOI) wafers, in large part arises from the difference in emissivity between the narrow edge exclusion and the rest of the SOI wafer.

Before the apparatus and processes related to this invention are presented, it is important to understand a few of the principles that affect these types of processes. Three important material properties play a role in the way in body reacts when heated by optical radiation. These properties are:

1. Absorptivity ($\alpha$): For an object that is receiving heat by radiation, absorptivity is defined as the fraction of that total energy that is absorbed by it. For the same amount of heat radiation, an object with higher $\alpha$ will experience a faster temperature rise than one with lower absorptivity. If substantially all the radiation is absorbed in the object, then the differential temperature rise applies to surface regions of the same thicknesses.

2. Reflectivity (R): Reflectivity is defined as the fraction of the total incident radiative energy that strikes the surface of the object and is reflected back away from the object.

3. Transmissivity ($\tau$): Transmissivity is defined as the fraction of the total incident radiative energy that reaches the object and passes through it without being absorbed or reflected.

As a consequence of the principle of energy conservation that energy is neither created nor destroyed, it follows that $$\alpha+R+\tau=1,$$

which simply states that all the energy that reaches a body either is absorbed by it, transmitted through it, or reflected back out.

The last physical property that plays a role in this process is the emissivity $\epsilon$. Emissivity is a measure of how efficiently a body radiates energy compared to a perfect emitter. This perfect emitter, usually called a "back body", has an emissivity $\epsilon$ equal to 1, but it is an idealization that never truly exists in nature. Real surfaces have emissivity values that range between the limits of 0 and 1. For radiation emitted from effective enclosures in bodies held at a constant temperature, the emissivity and absorptivity are related by an approximation called Kirkchhoff's Law which states that $$\alpha=\epsilon.$$

Figure 6:
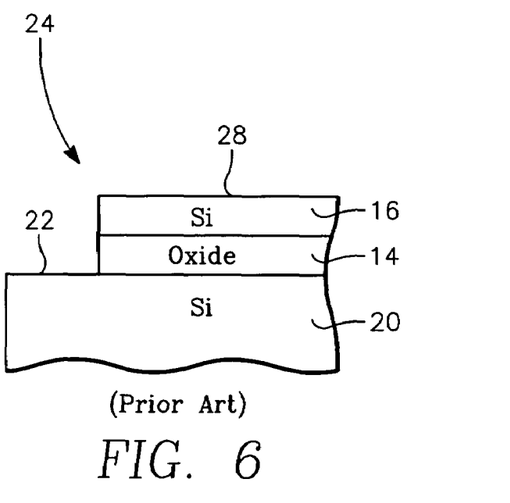

With reference to the structures of FIGS. 4 and 6, the edge exclusion 22 exposes a 30 bare or nearly bare silicon substrate 20, which has an emissivity of approximately $\epsilon=0.67$ while the multi-layer SOI stack of the thin silicon layer 16 underlain by the oxide layer 14 has an emissivity which depends on the two thicknesses but may be much smaller, for example, $\epsilon<0.3$. The edge exclusion 22 is relatively narrow, usually less than 3 mm while the RTP heating zones are much wider. As a result, the edge exclusion 22 and the outer portion of the SOI stack 14, 16 are exposed to the same amount of radiation from the lamps despite the difference in emissivity between the two regions. When the wafer is heated using radiation from lamps, this discontinuity in emissivity (and, from Kirkchhoff's law above, absorptivity) creates a highly undesirable temperature gradient at the periphery of the wafer that is very difficult to eliminate. The prior art method of reducing the temperature at the wafer periphery is effective at reducing the overheating of the edge exclusion 22 but it concurrently under heats the outer periphery of the SOI stack 14, 16.

The structure and operation of one embodiment of an RTP (rapid thermal processing) chamber 30, schematically illustrated in cross section in FIG. 7, will now be explained. The RTP chamber 30 includes a vacuum chamber 32 accommodating a wafer support 34 for supporting a wafer 36 in opposition to a lamphead 38, which radiantly heats the wafer 36 through a window 40, all of which are generally symmetrically arranged about a central axis 42. The lamphead 38 is formed of a metallic lamp body 44 which supports a large array of high-intensity incandescent lamps 46 disposed in holes 48 that act as light pipes for directing the lamp radiation through the window 40 towards the wafer 36. The lamps 46 are typically arranged in an hexagonal close packed array but they may be additionally grouped in multiple radial zones centered on the central axis 42.

The chamber 32 includes a main chamber body 48, which supports the window 40. O-rings 50, 52 seal the window 40 to the main chamber body 48 and the lamp body 44 when clamps 54 or other fixing means such as screws or bolts press them together. An annular channel 56 is formed in the main chamber body 48, in which is disposed a magnetic rotor 58, which can rotate about the central axis 42 in the annular channel 56. A magnetic stator 60 is driven by an unillustrated motor to rotate about the central axis 42 and is magnetically coupled through the main chamber body 48 to the magnetic rotor 58 to both support it in the vertical direction and to drive it to rotate about the central axis 42. The magnetic rotor 58 supports a tubular riser 61, which in turn supports an edge ring 62 having an annular lip 64 supporting at its tip the periphery of the wafer 36. A typical width of the lip 64 is about 4 mm. Thereby, the wafer 36 is rotated about the central axis 42, for example, at a speed of about 240 rpm. The tubular riser 61 is typically formed of silicon-coated quartz while the edge ring 62 is typically formed of silicon or silicon carbide. The inside of a bottom wall 66 of the main chamber body 48 underlying the wafer may be highly polished to form a black body cavity 68 below the wafer 36 for the thermal radiation emitted by the wafer 36 as the lamphead 38 radiantly heats it. An exemplary height of the black body cavity 68 is about 4.3 mm.

Multiple pyrometers 70, for example, seven, are coupled by light pipes 72 disposed in holes 74 formed in the bottom wall 66 at different radial positions to receive radiation from different radial portions of the wafer 36 or edge ring 62 to measure the radial distribution of temperature or other thermal property as the edge ring 62 and supported wafer 36 rotate about the central axis 42. A power supply controller 76 receives the outputs of the pyrometers 70 and accordingly adjusts the power delivered to the incandescent lamps 44. The power is varied to control the heating rate and is further differentially supplied to the radial heating zones, for example, 15 zones across a 300 mm wafer, to improve the radial temperature distribution across the wafer.

Figure 8:
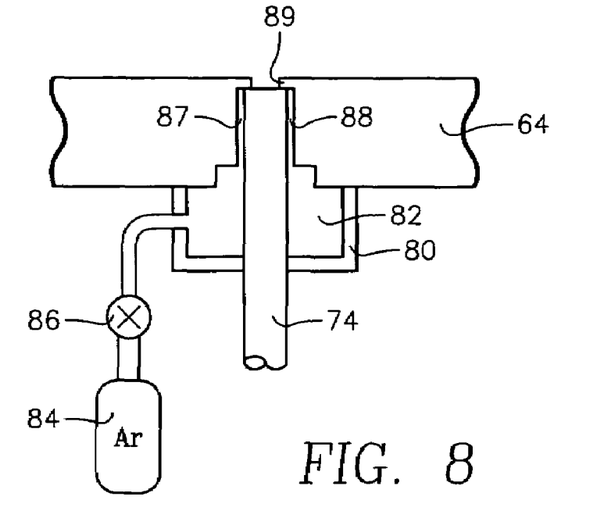
FIG. 8 is an exploded cross-sectional view of a pyrometer port of FIG. 7.

The receiving faces of the light pipes 72 tend to become coated with reaction byproducts during high temperature processing and any such coating would affect the thermal measurement processing. Accordingly, typically each light pipe 72, as illustrated in the schematic cross sectional view of FIG. 8, is sealed to the outside of the bottom wall 64 with a collar 80 forming a gas jacket 82 at the interface between the light pipe 72 and the bottom of the bottom wall 64. A purge gas such as argon is supplied from a gas source 84 through a mass flow controller 86 into the gas jacket 82, from which it passes through a small gap 87 between the sides of the light pipe 72 and the pyrometer hole 88 in the bottom wall 66, thereby keeping a receiving face 89 of the light pipe 72 clear of deposits but also supplying argon into the black body cavity 68.

Returning to FIG. 7, a processing space 90 is formed between the window 40 and the top surface of the wafer 36, for example, having a thickness of 36 mm. A processing gas, such as the argon/hydrogen mixture used for the SOI smoothing anneal may be supplied from the argon gas source 84 and from a hydrogen gas source 92 through respective mass flow controllers 93, 94 to a gas inlet 96 to the processing space 90. However, other processing gases may be used if the invention is applied to other production processes. A vacuum pump 98 is connected through a valve 100 to a pump port 102 on the side of the processing space 90 to exhaust the processing gas and reaction by products and, if desired, to pump the processing space 90 to a sub-atmospheric pressure.

A thermal transfer gas, such as helium, is supplied from a gas source 110 through a mass flow controller 112 to a gas manifold 114 in back of the lamp holes 48. Bulbs 116 of the lamps 46 are loosely fit within the lamp holes 48 and porous potting material fix the backs of the bulbs 116 to the tops of the lamp holes 48. The thermal transfer gas flows from the manifold 114 into the gaps between the lamp bulbs 116 and the sides of the lamp holes 48 to promote cooling of the lamps 46. A vacuum pump 118 may be connected through a valve 119 to the volume surrounding the bulbs 116 within the lamphead body 44 to reduce the pressure at the backside of the window 40 when the vacuum pump 98 evacuates the processing space 90 to a reduced pressure. Cooling channels 120 are formed in the lamphead body 44 to convey cooling water supplied through an inlet 122 and exhausted through an outlet 124. The cooling channels 120 surround the lamp holes 48 and thereby cool the lamps 46 with the assistance of the thermal transfer gas.

Figure 7:
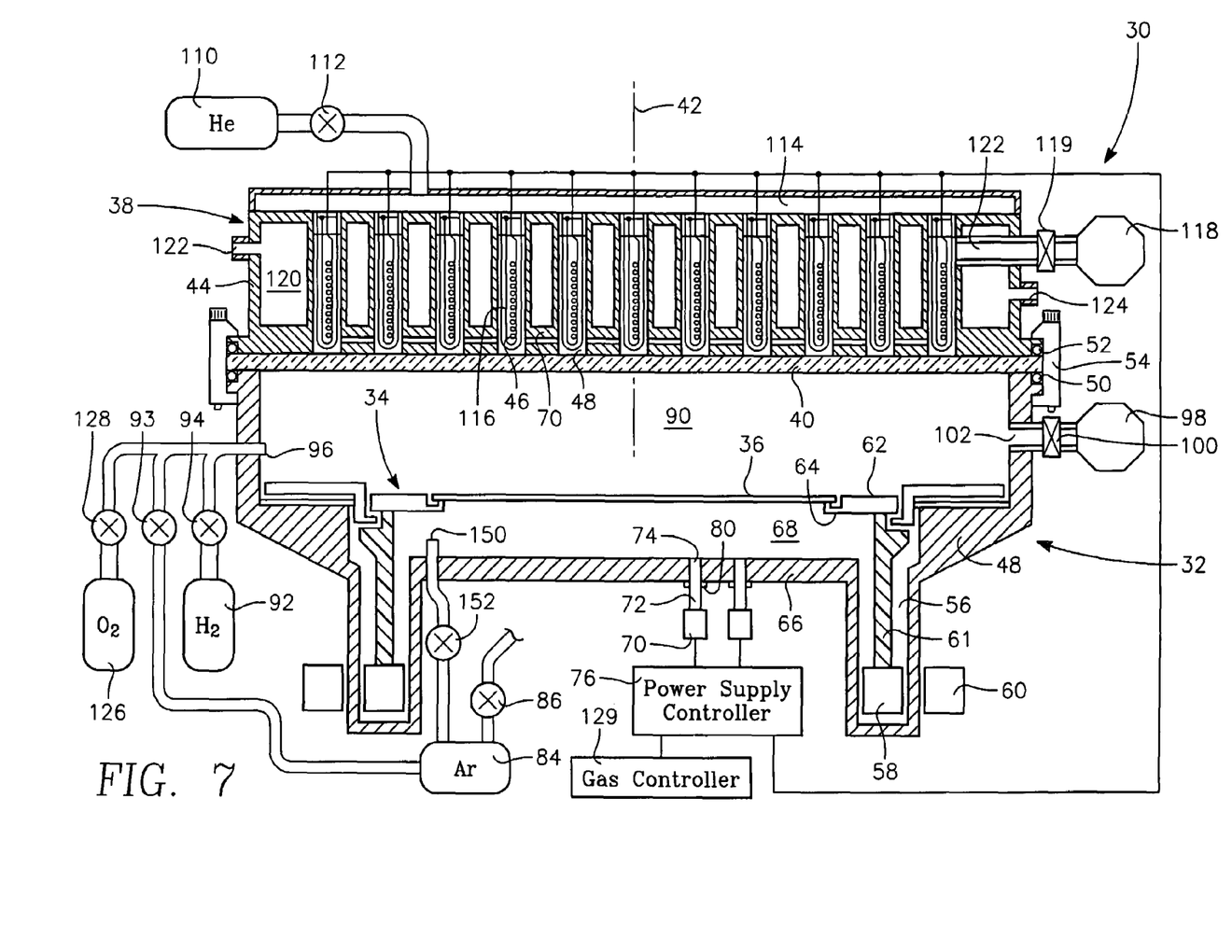
FIG. 7 is a schematic cross-sectional view of a rapid thermal processing (RTP) chamber included within at least one aspect of the invention.

Much effort is expended at developing acceptable production process conditions in the RTP chamber 30 of FIG. 7. These empirical optimizations are very time consuming and, in the case of SOI wafers, need to be repeated for each combination of oxide and silicon thicknesses. For SOI wafers, it has often been determined that slip can be reduced by setting the outer zone to be cooler by about 5 to 7° C. than the inner zones. Such a large thermal gradient, particularly in view of typically narrow temperature process windows, is contrary to the practice of uniform temperature. Although satisfactory results have been obtained, the temperature process window is very narrow, less than 1° C. Outside of the processing window, slip defects develop on the wafer. The problem is exacerbated by drifting chamber conditions, apparently caused by aging lamps or silicon vaporized at the high annealing temperatures and depositing on the quartz window or other chamber parts. As a result, it has been found necessary to retune the process at cycles of less than a hundred wafers. The retuning process consumes valuable time on production equipment thereby reducing throughput and requires the use of expensive SOI wafers, which cannot be reused.

One method of maintaining slip-free processing conditions is to establish production process conditions on SOI wafers in a,specific RTP chamber that yield slip-free wafers, for example, the smoothing anneal. After this optimized condition has been established, a "reference oxide profile" is established by performing an oxidation process in the same RTP chamber in the production chamber otherwise used for the SOI smoothing anneal. The chamber 30 is modified to include a gas source 126 and a mass flow controller 128 to supply oxygen or other oxidizing gas through the gas inlet 96 into the processing space 90. A gas controller 129 associated with the power supply controller 76 controls the various mass flow controllers, valve, and vacuum pumps to select either the production Ar/$H_2$ smoothing anneal or the monitoring oxidation process. The production and monitoring process recipes share some commonality, for example, the same radiant heating pattern across the lamp zones.

Figure 9:
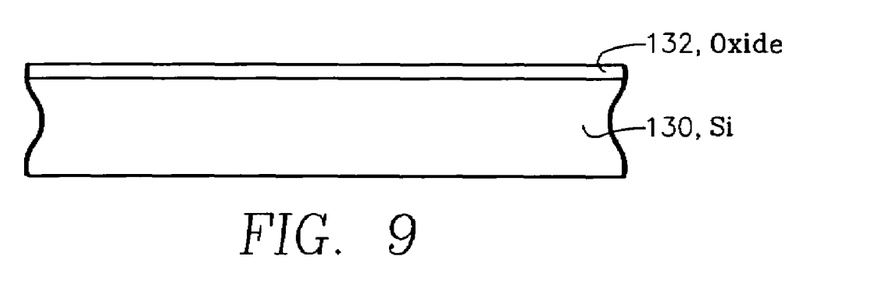
FIG. 9 is a cross-sectional view of a silicon wafer used oxidized in the RTP chamber of FIG. 7 and used in practicing the retuning process of another aspect of the invention.

The oxidation is economically performed on a bare silicon reference wafer 130, illustrated in the cross-sectional view of FIG. 9, in the same RTP chamber to be used for the smoothing anneal and using the slip-free SOI conditions established for that chamber. For example, the zonal heating distribution used to achieve slip-free SOI wafers is used for the oxidation of the bare silicon wafer. The oxygen ambient in the presence of the intense radiant energy oxidizes the surface of the silicon reference wafer 130 to produce an oxide layer 132. That is, the reference wafer 130 contains no silicon layer overlying the oxide layer 132. The thickness distribution of the oxide layer 132 produced in the reference wafer 130 is measured across the wafer 130 to produce a reference oxide profile 134 illustrated in FIG. 10. The thickness profile may be measured by an automated scanning ellipsometer, such as the Asset F5 available from KLA Tencor, or other conventional methods known for wafer inspection, Forty-nine points in the distribution seem to be adequate. Note that the reference profile 134 for the oxidized reference wafer differs significantly from the optimized SOI temperature profile for production wafers, which should be relatively flat to within a very few degrees. The thickness distribution of the oxide developed on the bare wafer should depend primarily upon the temperature distribution on the bare wafer. The proportionality of thickness versus temperature can be easily established for a bare wafer, more easily than for an SOI wafer where the proportionality may depend on the thicknesses of the already established layers. Typically, a class of RTP chambers is sufficiently characterized to allow the adjustment of temperature within a zone by changing in easily calculated amounts the power delivered to lamps within that and neighboring zones. As a result, measurement of the thickness pattern on the reference wafer allows correction of the temperature distribution across the wafer needed to achieve the uniformity achieved in the reference process and these corrections relate back to the optimized SOI process for production wafers. The process may also be retuned whenever excessive slip develops in production wafers or after a predetermined number of production cycles.

Figure 10:
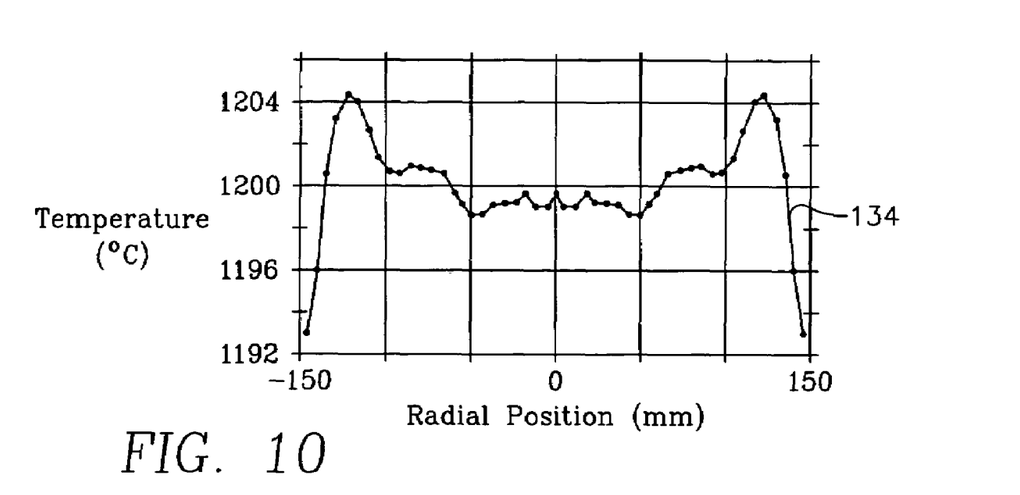
FIG. 10 is a graph of a temperature reference profile obtained from the oxidized silicon wafer of FIG. 9.

Once established, the reference profile 134 is stored as an archival distribution. The reference profile obtained on a bare wafer manifests non-uniform temperature but the same process performed on an SOI wafer produces a uniform temperature distribution within the established maximum temperature non-uniformity of, for example, 1%.

As the system ages and otherwise changes during use of sequentially processing a large number of production wafers, another bare silicon wafer, now called a monitor wafer, is oxidized according to a test oxidation recipe including the part shared with the optimized production process and another oxide profile is determined. The recently measured profile is compared to the archived reference profile 134 of FIG. 10. For example, whenever the chamber is opened for preventative maintenance, for replacing parts, or for other reasons, the production process may be retuned by producing another monitor wafer.

Based on the comparison of the thickness profile of the monitor wafer with the reference profile, the process in the system is retuned to return the process to the reference profile and these changes are incorporated into the part of the production recipe shared with the test recipe. The changes in process parameters necessary to achieve required changes are typically established for each chamber and possibly each process. The changes primarily affect the total radiant energy delivered by the lamps and the distribution of power to the different heating zones. To facilitate the process, the temperature reference profile 134 may be converted into an oxide thickness reference profile 136, illustrated in the graph of FIG. 11, by well known relationships between changes of temperature and changes in oxide growth rates. The thickness reference profile 136 is imported into a computer tuning program implemented in a spreadsheet program or a program containing executable modules Microsoft Excel application to allow the operators to quickly adjust all the needed chamber parameters to tune the process back to the reference profile. The retuned process is then used as a reoptimized process for subsequent runs of production wafers.

On subsequent retunings, the thickness profile of another monitor wafer is compared to the reference profile to make further adjustments from the reoptimized process.

Figure 11:
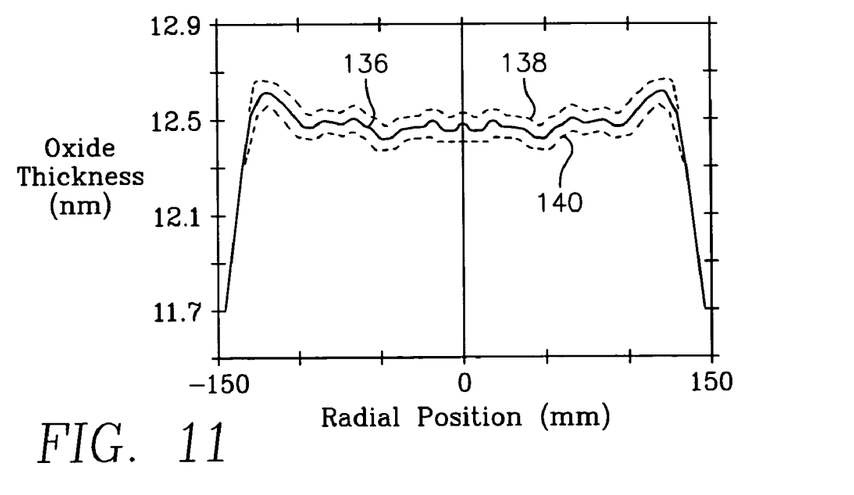
FIG. 11 is a graph showing a thickness reference profile adapted from the temperature reference profile of FIG. 10 and also showing a range of profiles obtained upon retuning the oxidation process according to the invention.

The process was tested by retuning the SOI process every 25 wafers. Eight such retunings were performed, that is, over 400 wafers. The retuned profiles generally followed the reference profile within a range bracketed by an upper profile limit 138 and lower profile limit 140. The range was less than about 0.2 nm for central reference thickness of about 12.5 nm. At the same time during the tests, an SOI production wafer produced by the retuned process was monitored for slip. Six of the wafers had zero slip lines and two had one slip line, which results are within the specification of the process. One SOI monitor wafer had ten slip lines. The last is considered a data outlier and of questionable validity. In comparison, the conventional method, which uses several SOI wafers for retuning the annealing process for slip-free conditions whenever the chamber starts drifting, routinely produces tens of slip line defects on each wafer.

The retuning process of the invention provides several advantages. The conventional retuning consumes expensive SOI wafers while the invention uses a much less expensive bare silicon wafer as a reference or monitor wafer. Furthermore, the oxidized reference or monitor wafer can be stripped of its oxide layer in an HF bath and reused. Only one monitor wafer needs to be processed for each retuning rather than the several SOI wafers used in the past to determine slip-free conditions. The simple monitor structure allows easy and automated measurement of thickness profiles while the generation of slip in the more complex SOI wafers requires more operator attention. The thickness profiles in the monitor wafers can be quantitatively related to thickness and temperature profiles of the reference wafer to determine what heating zones need adjustment which direction and in what degree while generation of slip does not provide a quantifiable temperature profile.

The reference profile 134 illustrated in FIG. 10 shows very strong edge effects in that less radiant energy is needed closer to the edge than in the center to achieve uniform temperature on an SOI wafer. The edge effects for SOI processes are exacerbated by the relatively low emissivity values for the SOI film stacks. As a result, the usual tuning compensates for the additional heat that is absorbed at the edge of the SOI wafer near the edge ring 62, which may be considered as being bulk silicon. The profile data suggests that the edge of an SOI wafer may be as much as 8° C. hotter than the rest of the wafer. Although the emissivity discontinuity presented by the edge ring is typically compensated by other approaches such as a specially shaped discontinuity, the invention as described is effective at further compensating the edge ring discontinuity in the face of process drift and aging of the chamber and its parts.

The previously described retuning uses two different gas ambients for the production and monitor processes. It is possible in some circumstances that the same gas ambients be used on different types of wafers, but the monitor wafers may have a less complex structure than the production wafers.

A wafer processed with perfectly uniform temperature would be subject to no thermal stress and hence develop no slip defects. The maximum amount of thermal gradient or non-uniformity a wafer can experience before excessive slip occurs is usually called the slip tuning window. The size of the slip tuning window is usually expressed in degrees Celsius of allowable temperature variation at any point on the wafer before slip defects start to appear. Obviously in mass production, it is desirable to have as large a slip window as possible since chamber effects change and it is economically desired to minimize the number of times that a reoptimization be performed. The previously described process utilizing reference profiles has been shown to successfully produce slip-free SOI wafers, but the slip tuning window using retuning is not as large as desired and may be less than 1° C. It is desired to use an apparatus which widens the slip tuning window or other process window by reducing the edge effects by means other than strong and abrupt changes in irradiance profile, that is, by making the apparatus inherently produce a more uniform temperature.

The SOI process seems to produce an overly hot wafer periphery when using an SOI wafer. Most probably, the edge ring 62 of FIG. 7 supporting the wafer 36 and the edge exclusion zone if present are more efficient at absorbing radiation than is the wafer 36 and hence is hotter than the central parts of the wafer 36. Attempts to counter the discontinuity in emissivity by adjusting the distribution of zonal heating suffer from the relatively wide heating zones in comparison to the narrow transition from the SOI stack to the edge exclusion and the edge ring.

One method of more directly reducing the edge temperature includes injecting a jet of argon or other inert gas such as helium through a jet injector 150 located in the bottom wall 66 generally below the lip 64 of the edge ring 62 and aimed toward the periphery of the wafer 36 including immediately outwardly thereof. The jetted argon effectively cools the region it strikes, particularly the edge ring 62 and the very outer portion of the wafer 36 it supports and a limited more inward region of the wafer 36, both by the lower temperature of the argon and by the increased convective thermal transfer to the cooled bottom wall 66 forming the bottom of the black body cavity 68.

Figure 12:
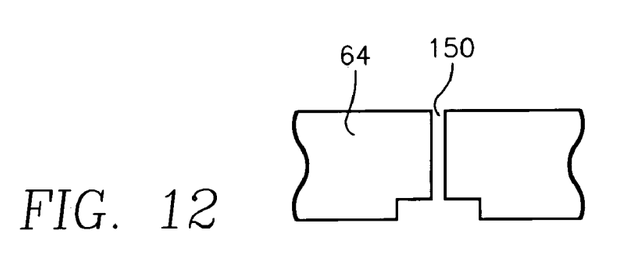
FIG. 12 is an exploded cross section view of the injector jet of the FIG. 8, which is an embodiment of yet another aspect of the invention.

The argon may be supplied from the same source 84 supplying the pyrometer purge gas but is optionally separately metered through a dedicated mass flow controller 152. Optionally, a single mass flow controller can control the delivery of argon to the seven pyrometers and to the injector jet with the injector jet sized to deliver the desired amount of argon. For example, as illustrated in the cross-sectional view of FIG. 12, the jet injector 150 has a diameter of 45 mils (1.1 mm) compared to a principal diameter of the pyrometer holes 88 of FIG. 8 of 125 mils (3.2 mm). These relative sizes combined with a required gap 87 and a thickness of the blackbody cavity 68 of 4.3 mm has been used to deliver enough cooling gas to the edge injector 150 to lower the edge temperature by about 5° C., a value found adequate for different types of SOI wafers. The processing vacuum pump 98 pumps all the argon around the support structure and out of the blackbody cavity 68 and the processing space 90 to allow a continuing flow past the pyrometers and jetted towards the edge ring 62.

The effect of the argon jet is to cool the periphery of the wafer by a few degrees so that less zonal heating or other chamber control is required to compensate for edge effects. The inherently more uniform temperature is believed to increase the slip window, allowing a more commercial process. For example, the need for time consuming retuning will be reduced.

Although the invention has been developed for RTP including radiant lamps, it may be applied to other types of thermal processing including the scanning of narrow lines of laser radiation across a wafer or other substrate.

Figure 13:
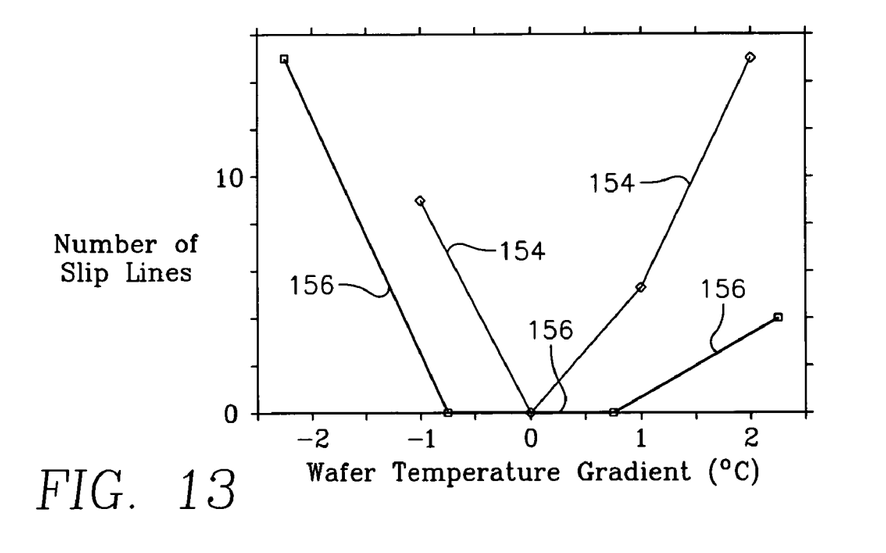
FIG. 13 is a graph illustrating the slip process window achievable with different aspects of the invention.

A test was made to compare the slips produced with and without the use of the edge gas jet. The temperature gradient across SOI wafers was systematically varied during a smoothing anneal of the wafers. The numbers of slip defects were measured on wafers respectively produced at the selected temperature gradient and with or without the edge gas jet. The results shown in the graph of FIG. 13 include a plot 154 for the number of slip defects as a function of temperature gradient using the previously described tuning procedure and a plot 156 for the combination of the edge jet and the tuning procedure. Negative temperature gradients means that the edge of the wafer was intentionally made cooler than the center. There is only one measured zero-defect point without the edge jet, but the slip window is about 1.4° C. with the edge jet. These results are very preliminary but demonstrate a clearly wider slip window utilizing the inventive edge jet.

The above described two methods in combination are very effective at providing a production-worthy process of smoothing SOI and other wafers. However, either one or the other of the two approaches may be used by itself to improve the temperature uniformity of the process. The invention is particularly applicable to smoothing SOI wafers, but the invention is not so limited and may be applied to other forms of thermal processing including chemical vapor deposition, particularly where a complex substrate having one or both of vertical and horizontal structure formed therein is annealed or otherwise processed. The less complex reference and monitor wafers are less expensive and may be easily processed to obtain the monitoring results, such as an oxidation thickness profile.

The invention claimed is:

1. A compensation method in the thermal processing of production substrates within a processing chamber including an array of incandescent lamps, comprising the steps of:
    (a0) an initial step of thermally processing in the processing chamber a reference substrate supported on a single-wafer support in opposition to the array of incandescent lamps;
    (a) then thermally processing in the processing chamber a plurality of production substrates successively supported on the single-substrate support according to a production recipe;
    (b) thereafter thermally processing in the processing chamber a monitor substrate similar to the reference substrate, of less horizontal structural complexity than the production substrates, and supported on the single-substrate support in the processing chamber according to a test recipe incorporating part of the production recipe including a distribution of power to the lamps arranged in the radial zones;
    (c) adjusting the production recipe in the processing chamber according to a profile of measured values across the processed monitor wafer, wherein the adjusting step compares the profile of measured values across the monitor substrate to a profile of measured values across the reference substrate; and
    (d) repeating step (a) with another production substrate according to the adjusted production recipe.

2. The method of claim 1, wherein a plurality of production substrates are thermally processed in step (a) before the monitor substrate is processed in step (b).

3. The method of claim 1, wherein the array of incandescent lamps are arranged in radial zones and wherein the part of the production recipe includes a distribution of separately selected power to the lamps arranged in the different zones.

4. The method of claim 1, wherein the production recipe includes an anneal in a hydrogen-containing ambient and the test recipe includes oxidation.

5. The method of claim 1, wherein the incandescent lamps are arranged in separately controllable radial heating and wherein the adjusting step includes changing a relative amount of power delivered to the lamps arranged in the radial heating zones.

6. The method of claim 1, wherein the adjusting step compensates for detuning of the process in step (b).

7. The method of claim 1, wherein the profile of measured values across the reference substrate accounts for edge effects occurring in the production substrates.

8. A method of compensating for thermally processing a production wafer comprising at least one of a vertical structure and a horizontal structure according to a production process, wherein the processing includes radiantly heating the production wafer within a chamber with an array of lamps, comprising the steps of:
- (a) obtaining a set of production process conditions for treating substrates according to the production process conditions;
- (b) a first step of processing a reference substrate comprising a reference structure of less complexity than the vertical and horizontal structure according to a set of test process conditions;
- (c) measuring the reference substrate to determine a reference profile across the reference substrate, wherein the reference profile reflects non-uniform edge effects resulting from the horizontal structure of the production wafer;
- (d) a second step of processing a plurality of production substrates according to the set of production process conditions;
- (e) thereafter, a third step of processing a test substrate comprising the reference structure according to the set of test process conditions;
- (f) measuring the test substrate to determine a test profile across the test substrate;
- (g) in comparison of the test profile to the reference profile, adjusting the set of production process conditions to compensate for detuning of the process in step (d); and
- (h) thereafter returning to step (d).

9. The method of claim 8, wherein the set of production process conditions include a production zonal heating distribution produced by the array of lamps which is substantially the same as a test zonal heating distribution of the test process conditions.

10. The method of claim 8, wherein the lamps are arranged in separately controllable radially arranged heating zones and wherein the adjusting includes changing a relative amount of power delivered to the lamps in different ones of the zones.

11. The method of claim 8, wherein the first and third processing steps each include heating reference and test substrates and exposing them to an oxygen-containing ambient and the reference profile and the test profile comprise thickness profiles.

12. The method of claim 8, wherein the adjusting step compensates for detuning of the process in step (d).

13. The method of claim 11, wherein the production process smooths a surface of a cleaved SOI substrate.

14. The method of claim 13, wherein the reference and test substrates comprise substantially bare silicon wafers.

15. A method of compensating for thermally processing a production wafer comprising at least one of a vertical structure and a horizontal structure according to a production process, wherein the processing includes radiantly heating the production wafer within a chamber with an array of lamps, comprising the steps of:
- (a) obtaining a set of production process conditions for treating substrates according to the production process conditions;
- (b) a first step of processing a reference substrate comprising a reference structure of less complexity than the vertical and horizontal structure according to a set of test process conditions;
- (c) measuring the reference substrate to determine a reference profile across the reference substrate;
- (d) a second step of processing a plurality of production substrates according to the set of production process conditions including injecting along a direction anti-parallel to a direction in which the array of lamps irradiate the production substrates a stream of gas preferentially toward a periphery of the substrate during the second processing step;
- (e) thereafter, a third step of processing a test substrate comprising the reference structure according to the set of test process conditions;
- (f) measuring the test substrate to determine a test profile across the test substrate;
- (g) in comparison of the test profile to the reference profile, adjusting the set of production process conditions to compensate for detuning of the process in step (d); and
- (h) thereafter returning to step (d).

16. The method of claim 15, wherein the set of production process conditions include a production zonal heating distribution produced by the array of lamps which is substantially the same as a test zonal heating distribution of the test process conditions.

17. A thermal processing method, comprising radiantly heating a substrate from a plurality of incandescent lamps directing radiation to a first side of the substrate along a first direction while injecting a stream of gas comprising argon along a direction anti-parallel to the first direction and preferentially toward a periphery of a second side of the substrate opposite the first side into a region between the second side of the substrate and a cooled bottom wall to thereby promote convective heat transfer to the cooled bottom wall.

18. The method of claim 17, wherein the stream of gas is injected to strike an edge ring supporting the substrate.

19. A compensation method in the thermal processing of production substrates within a processing chamber including an army of incandescent lamps, comprising the steps of:
- (a) thermally processing in the processing chamber a plurality of production substrates successively supported on a single-substrate support in opposition to the array of incandescent lamps in the processing chamber according to a production recipe;
- (b) thereafter thermally processing in the processing chamber a monitor substrate of less horizontal structural complexity than the production substrates and supported on the single-substrate support in the processing chamber according to a test recipe incorporating part of the production recipe including a distribution of power to the lamps arranged in the radial zones;
- (c) adjusting the production recipe in the processing chamber according to a profile of measured values across the processed monitor wafer;
- (d) repeating step (a) with another production substrate according to the adjusted production recipe;

and further comprising the preceding steps of:
- (a1) obtaining a set of production process conditions forming a production recipe for treating substrates;
- (b1) a first step of processing a reference substrate comprising a reference structure according to a set of test process conditions, wherein the reference structure is of less complexity than a vertical and horizontal structure according to the production recipe; and (c1) measuring the reference substrate to determine a reference profile across the reference substrate; wherein the thermally processing step processes a plurality of production substrates according to the production recipe; and wherein the adjusting step includes (f1) a step of measuring the monitor substrate to determine a test profile across the test substrate and wherein the adjusting is performed in comparison of the test profile to the reference profile.

* * * * *